United States Patent [19]
Cooper

[11] Patent Number: 4,591,741
[45] Date of Patent: May 27, 1986

[54] DRIVE CIRCUIT FOR OUTPUT PULL-DOWN TRANSISTOR

[75] Inventor: Michael D. Cooper, Garland, Tex.

[73] Assignee: Texas Instruments Incorporated, Dallas, Tex.

[21] Appl. No.: 586,535

[22] Filed: Mar. 5, 1984

[51] Int. Cl.[4] .................. H03K 19/013; H03K 19/088
[52] U.S. Cl. ..................................... 307/456; 307/443; 307/473
[58] Field of Search ................... 307/200 A, 443, 454, 307/456, 458, 473, 254, 270, 362, 544

[56] References Cited

U.S. PATENT DOCUMENTS

| | | | |
|---|---|---|---|
| 4,131,808 | 12/1978 | Kuo | 307/443 X |
| 4,287,433 | 9/1981 | Goodspeed | 307/456 X |
| 4,311,927 | 1/1982 | Ferris | 307/473 |
| 4,321,490 | 3/1982 | Bechdolt | 307/443 X |
| 4,330,723 | 5/1982 | Griffith | 307/443 X |
| 4,339,676 | 7/1982 | Ramsey | 307/456 X |
| 4,449,063 | 5/1984 | Ohmichi et al. | 307/456 |

Primary Examiner—Stanley D. Miller
Assistant Examiner—D. R. Hudspeth
Attorney, Agent, or Firm—Richard A. Bachand; N. Rhys Merrett; Melvin Sharp

[57] ABSTRACT

A circuit for clamping the base of an output pull-down transistor includes a clamp transistor connecting the base of the pull-down transistor to a ground node and a drive circuit for rapidly turning on the clamp transistor in response to a high-to-low transition on an input node. The drive circuit includes a string of Schottky diodes connecting the base of the clamp transistor to the collector of a transistor whose base is responsive to the voltage on the input node.

4 Claims, 2 Drawing Figures

DRIVE CIRCUIT FOR OUTPUT PULL-DOWN TRANSISTOR

The present invention generally pertains to fast operating bipolar logic circuits and has for principal object the provision of an improved output circuit for an integrated circuit device.

Figure 1:
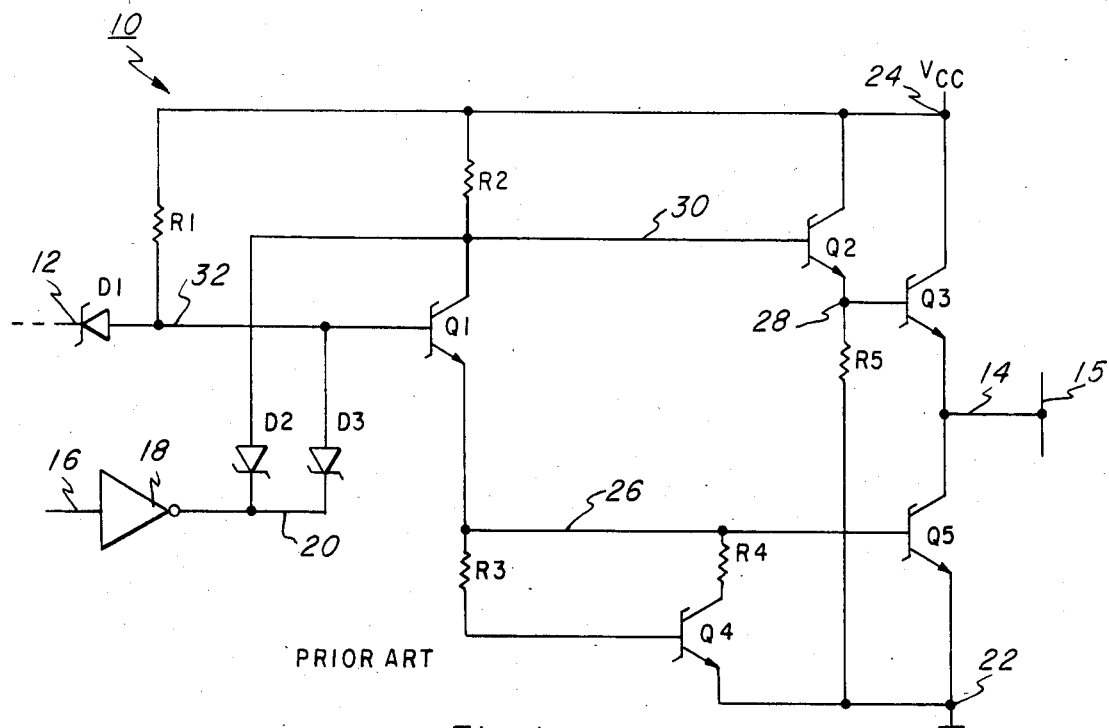
Figure 2:
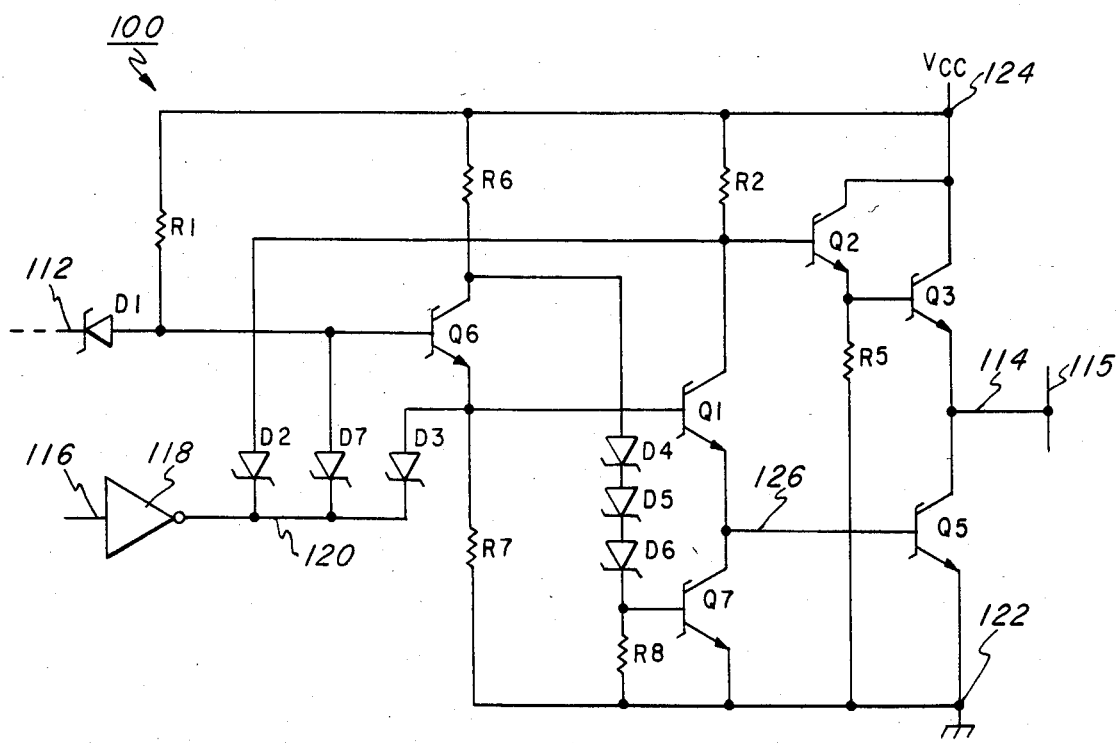

Other objects and advantages of the invention will become apparent from the following description of a preferred embodiment illustrated in the accompanying drawing, wherein:

FIG. 1 is a schematic of a prior art circuit; and
FIG. 2 is a schematic of the inventive circuit.

With reference to FIG. 1, a conventional output circuit for an integrated circuit device is denoted generally by reference numeral 10. The circuit 10 is connected between an input node 12 and an output node 14. The input node 12 forms the cathode of a Schottky diode $D_1$. The output node 14 is connected to a logic bus 15 which interconnects other integrated circuit devices. A 3-state control node 16 provides another input to the circuit 10. Node 16 is coupled by an inverter 18 to node 20 which forms the common cathode connection of Schottky diodes $D_2$ and $D_3$. The output node 14 is connected to a low voltage source node 22 by a pull-down Schottky-clamped transistor $Q_5$. The transistor $Q_5$ is typically very large in size in order to be able to rapidly discharge the logic bus 15. A high voltage source denoted $V_{cc}$ at node 24 is connected to the output node 14 through transistor $Q_3$. The base drive to transistor $Q_5$ is controlled by Schottky-clamped transistors $Q_1$ and $Q_4$. The base of $Q_5$ and the emitter of $Q_1$ are connected in common at node 26. The base and collector of $Q_4$ are connected to node 26 via resistors $R_3$ and $R_4$, respectively. The emitters of $Q_4$ and $Q_5$ are connected in common at node 22. The base drive to transistor $Q_3$ is controlled by Schottky-clamped transistor $Q_2$, the collector of which is connected in common with the collector of transistor $Q_3$ at node 24. The emitter of $Q_2$ and base of $Q_3$ form a common node 28 which is connected to node 22 via resistor $R_5$. The base $Q_2$ and collector of $Q_1$ form a common node 30 which is connected to node 24 via resistor $R_2$ and to node 20 via diode $D_2$. The base of transistor $Q_1$ and the anodes of diodes $D_1$ and $D_3$ form a common node 32 which is connected to node 24 via resistor $R_1$.

In operation, the output node 14 is held low when transistor $Q_5$ is turned on by current supplied by transistor $Q_1$. Resistors $R_3$ and $R_4$ and transistor $Q_4$ constitute a conventional active turn-off circuit which sinks current from node 26 turning off $Q_5$ and $Q_1$ is off. However, with $Q_1$ on, sufficient current is supplied to node 26 to drive $Q_5$ on. A high logic level at input node 12 and a low logic level at the 3-state input 16 keeps $Q_1$ on, which in turn draws current from node 30 keeping $Q_2$ and $Q_3$ off. Those skilled in the art will appreciate that a high logic level at 3-state input 16 causes both $Q_1$ and $Q_2$ to turn off which in turn causes $Q_3$ and $Q_5$ to turn off, thus isolating the circuit 10 from the bus 15. Assuming, however, that node 16 remains low, a high to low transition at input node 12 causes $Q_1$ to turn off and then, after a delay, $Q_5$ turns off.

A significant problem associated with the delay in turning off $Q_5$ is that $Q_3$ starts to turn on before $Q_5$ is off. It will appreciated that a very low impedance is presented between nodes 24 and 22 when both $Q_3$ and $Q_5$ are in the conducting state. As an undesirable consequence, a power supply current spike occurs. The problem becomes more serious at higher frequencies, thus limiting the maximum operating frequency of the circuit.

An additional problem occurs when the circuit 10 is disabled by a high logic signal at the 3-state input 16. Under this condition, both $Q_3$ and $Q_5$ should be off in order to isolate the circuit 10 from the logic bus 15. However, a fast rising pulse edge on the bus 15 can be capacitively coupled to the base of $Q_5$ so as to cause $Q_5$ to turn on briefly with the possibility of conveying a false signal on the bus 15.

Now referring to FIG. 2, a circuit 100 embodying the present invention will be described. Elements in the inventive circuit 100 that function like elements in the prior art circuit 10 labeled with the same reference characters.

In circuit 100, the base drive for transistor $Q_5$ is controlled by Schottky-clamped transistors $Q_1$ and $Q_7$. The base drive for $Q_1$ is supplied by Schottky-clamp transistor $Q_6$. The base of $Q_7$ is connected to ground node 122 via resistor $R_8$ and to the collector of $Q_6$ via a series of three Schottky diodes $D_4$, $D_5$ and $D_6$. The high voltage source node 124 is connected to the collector of $Q_6$ via resistor $R_6$ and to the base of $Q_6$ via resistor $R_1$. The base of $Q_6$ is connected by a Schottky diode $D_7$ to node 120, which is the output of inverter 118. Resistor $R_7$ connects the emitter of $Q_6$ to ground node 122.

When the 3-state input 116 is at a low logic level, the circuit 100 operates as follows. A high logic level at input node 112 is conveyed via $D_1$ to the base of $Q_6$, turning on $Q_6$. When $Q_6$ turns on, $Q_1$ turns on and $Q_7$ turns off, causing $Q_5$ to turn on. When $Q_1$ turns on, it diverts base drive from $Q_2$ which turns off. Also, with $Q_2$ off, the base of $Q_3$ is discharged through $R_5$ turning off $Q_3$. This enables $Q_5$ to pull down the ouput node 114 and the logic bus 115 connected thereto.

When $Q_7$ is off, a small bias current flows from the collecter of $Q_6$ through diodes $D_4$, $D_5$ and $D_6$ and resistor $R_8$ to provide a voltage across $R_8$. Using conventional manufacturing techniques, the characteristics of the circuit elements are selected so that the voltage on the base of $Q_7$ preferably will be maintained at about 400 mv or slightly less than the $V_{BE}$ required to turn on $Q_7$. The difference between the voltage on the collector of $Q_6$ and the voltage on the base of $Q_7$ is equal to the sum of the forward voltage drops across $D_4$, $D_5$ and $D_6$. This voltage differential remains substantially constant since $D_4$, $D_5$ and $D_6$ remain forward biased whether $Q_6$ is on or off. Each of the three diodes has a forward voltage drop of about 0.5 volts. It will be appreciated that Schottky diodes have negligible capacitances particularly while operating in the forward conducting state. Thus, when $Q_6$ changes state, the voltage swing on its collector appears essentially contemporaneously at the base of $Q_7$. The voltage swing is preferably about 400 mv going from a level when $Q_6$ is off equal to the sum of the voltage drops across $D_4$, $D_5$ and $D_6$ and the $V_{BE}$ of $Q_7$ to a level when $Q_6$ is on equal to the sum of the $V_{CE}$ of $Q_6$ plus the $V_{BE}$ of $Q_1$ plus the $V_{BE}$ of $Q_5$.

Now, assuming that a high-to-low transition occurs at input node 112, the circuit 100 responds as follows. Transistor $Q_6$ switches from on to off causing the voltage on the base of $Q_7$ to rise with the rising voltage on the collector of $Q_6$. It will be appreciated that $Q_7$ turns on rapidly while $Q_1$ is being turned off as its base is discharged through $R_7$. This permits the base of $Q_5$ to be pulled down fast via the low impedance provided by $Q_7$, thus turning off $Q_5$ before $Q_3$ turns on. The response of $Q_3$ must await $Q_1$ turning off and the charging of the base of $Q_2$ through resistor $R_2$ in order to turn on $Q_2$.

The circuit 100 eliminates the power supply current spikes mentioned above in connection with the prior-art circuit 10 because $Q_5$ is turned off very quickly by $Q_7$ prior to $Q_3$ turning on. Transistor $Q_7$ turns on very quickly because its base is held at about 400 mv while $Q_6$ is on and then rises quickly with the collector of $Q_6$ as $Q_6$ turns off.

An additional advantage of the circuit 100 is in its superior operation in the so-called high impedance mode when a high logic level is received at 3- state input 116. When this occurs, node 120 is pulled low causing the bases of transistors $Q_2$ and $Q_1$ to be discharged through diodes $D_2$ and $D_3$, respectively. This causes transistors $Q_2$ and $Q_1$ to turn off. Diodes $D_7$ and $D_3$ set the voltage across the base-emitter junction of transistor $Q_6$ to approximately zero volts. This causes transistor $Q_6$ to turn off. With $Q_2$ off, transistor $Q_3$ turns off for lack of base drive. The base of $Q_7$ rises following the collector of $Q_6$ causing $Q_7$ to turn on and $Q_5$ to turn off. Because $Q_7$ provides a very low impedance path from node 126 to ground node 122, any charge capacitively coupled from the logic bus 115 through the collector-base junction of $Q_5$ onto node 126 is quickly discharged to ground. This prevents $Q_5$ from inadvertently turning on due to fast rising edges appearing on bus 115, thus eliminating a potential problem exhibited in the prior-art circuit 10.

From the foregoing description it will be apparent that the present invention overcomes significant problems that have persisted in prior-art circuits. Although a preferred embodiment has been described in detail, it will be understood that various modifications and adaptations thereof are within the spirit and scope of the invention as defined by the appended claims.

What is claimed is:

1. An integrated circuit comprising:
a first transistor having its collector connected to an output node and its emitter connected to a low voltage source:
a second transistor having its emitter connected to the output node and its collector connected to a high voltage source:
a third transistor having its collector connected to the base of the first transistor and its emitter connected to the low voltage source:
a fourth transistor having its emitter connected to the base of the first transistor for driving the first transistor:
a fifth transistor having its emitter connected to the base of the fourth transistor:
means connected to the base of the second transistor for driving the second transistor in response to the fourth transistor to turn off the second transistor when the first transistor is on:
means connected between the base of the third transistor and the collector of the fifth transistor for driving the third transistor and for maintaining a voltage level on the base of the third transistor equal to the voltage on the collector of the fifth transistor less a substantially constant voltage; and
means connected to the base and emitter of the fifth transistor and to the base of the second transistor for maintaining both the first and second transistors off in response to a high logic level of a 3-state input signal:
the base of the fifth transistor being responsive, when the 3-state input signal is in a low state, to an input signal of a first logic level to cause the fourth transistor to drive the first transistor on while the third transistor driving means holds the third transistor off, and to an input signal of a second logic level to cause the third transistor driving means to drive the third transistor on to discharge the base of the first transistor to hold the first transistor off.

2. The output circuit of claim 1 wherein the third transistor driving means includes at least one Schottky diode connected between the collector of the fifth transistor and the base of the third transistor.

3. The output circuit of claim 1 wherein the third transistor driving means includes a string of Schottky diodes connected between the collector of the fifth transistor and the base of the third transistor.

4. The output circuit of claim 3 wherein the third transistor driving means further includes a resistor connecting the base of the third transistor to the low voltage source.

* * * * *